(12) United States Patent
Takasaki et al.

(10) Patent No.: US 6,835,434 B2
(45) Date of Patent: Dec. 28, 2004

(54) METHOD FOR MANUFACTURING DISC-SHAPED OPTICAL RECORDING MEDIUM AND DISC-SHAPED SUBSTRATE FOR OPTICAL RECORDING MEDIUM

(75) Inventors: Hiroshi Takasaki, Tokyo (JP); Hideki Ishizaki, Tokyo (JP); Mamoru Usami, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/357,205

(22) Filed: Feb. 4, 2003

(65) Prior Publication Data

US 2003/0150100 A1 Aug. 14, 2003

(30) Foreign Application Priority Data

Feb. 4, 2002 (JP) ......................................... 2002-027036

(51) Int. Cl.[7] .................................................. B32B 3/02
(52) U.S. Cl. .................... 428/64.1; 428/64.4; 430/270.1
(58) Field of Search ............................... 428/64.1, 64.4, 428/913; 430/270.1, 495.1, 945; 369/282

(56) References Cited

U.S. PATENT DOCUMENTS 5,272,581 A * 12/1993 Kojima et al. ........... 360/98.01

FOREIGN PATENT DOCUMENTS

| JP | 10-040584 A1 | 2/1998 |
| JP | 2001-246643 A1 | 9/2001 |

* cited by examiner

*Primary Examiner*—Elizabeth Mulvaney
(74) *Attorney, Agent, or Firm*—Oliff & Berridge, PLC

(57) ABSTRACT

A disc-shaped substrate for a disc-shaped optical recording medium is accurately and stably positioned and held during a sputtering process. A non-sputtering surface of the disc-shaped substrate opposite to a sputtering surface has a circular recess formed at a center thereof. A carrier, on which the disc-shaped substrate is supported during the sputtering process, has a projective member for fitting into the circular recess to accurately position and hold the disc-shaped substrate during the sputtering process.

21 Claims, 4 Drawing Sheets

METHOD FOR MANUFACTURING DISC-SHAPED OPTICAL RECORDING MEDIUM AND DISC-SHAPED SUBSTRATE FOR OPTICAL RECORDING MEDIUM

DETAILED DESCRIPTION OF THE INVENTION

1. Field of the Invention

The present invention relates to a method for manufacturing a disc-shaped optical recording medium and a disc-shaped substrate processed thereto.

2. Description of the Related Art

Disc-shaped optical recording media (optical discs) such as CD (Compact Disc) and DVD (Digital Versatile Disc) have an injection-molded disc-shaped substrate including an information recording surface. In a predetermined region of the information recording surface of the substrate, a writable recording layer for recording information, a reflective layer to allow reproduction, and the like are formed. Then, a resinous protection layer is formed thereon to complete the disc-shaped optical recording media. When a prescribed laser beam is irradiated through the disc-shaped substrate, information is recorded on and/or reproduced from the media.

Recently, another optical disc has been gaining attention. The disc is produced by a method, as disclosed in Japanese Patent Laid-Open Publication No. Hei. 8-235638, for example, in which a support layer (protection layer) that does not have to transmit light, in other words, without optical thickness requirement is formed to be thick by injection molding as a disc-shaped substrate. A reflective layer to allow reproduction, a writable recording layer and the like are formed on the information recording surface side of the substrate, and then a light transmitting layer of transparent resin that can transmit a laser beam for recording/reproducing is formed on the top of the other layers.

According to a conventional method of manufacturing an optical disc, when the substrate is injection molded, a center portion of the substrate and a sprue runner-solidified inside a gate for use in injection molding are removed to form a circular central hole in the center of the substrate. Then, a reflective layer and a writable recording layer, as described above, are formed on the substrate. A resinous protection layer and a-light transmitting layer of light transmitting resin are then formed by spin-coating, for example, in the next process, and then the optical disc is completed.

As disclosed by Japanese Patent Laid-Open Publication No. Hei. 10-249264, one of characteristic manufacturing methods of such a protection layer or a light transmitting layer is that a lid member is fitted into the central hole of the optical disc to cover the hole, over which resin is spread over the whole surface of the optical disc by spin-coating, and cured to form the protection layer (resin layer). This method can easily control thickness of the resin layer, so that it is possible to form the resin layer to have uniform thickness, particularly, in a radial direction. Thus, the method is applicable to the formation of the light transmitting layer as disclosed by Japanese Patent Laid-Open Publication No. Hei. 8-235638.

As described above, the method with the lid member for covering the central hole of the substrate is effective to form a more uniform resin layer in spin-coating of the resin layer. However, there is a disadvantage that the method has to always use a new (clean) lid member. Thus, a cleaning process for cleaning the lid member is required each time after the spin-coating of resin, or the lid member has to be disposable.

Therefore, the present inventors have invented a manufacturing method of a substrate according to which a central hole for optical disc chucking is formed after the resin layer is formed based on a different point of view from the above-mentioned conventional art. According to this manufacturing method, it is possible to simplify manufacturing processes and to improve a yield in forming of the resin layer as compared to the conventional method using a lid member. They have also suggested a disc-shaped optical recording medium which has no central hole and in which the recording layer extends up to the region corresponding to the central hole and the region for chucking in the prior art disc.

During a sputtering process for forming the recording layer, etc, the substrate has to be fixed in a predetermined position, and the central hole of the conventional substrate formed at the time of injection molding is used as a chuck for fixing its position. Thus, the substrate without any central hole cannot be positioned by the conventional fixing method.

In this case, it is conceivable to use an outer mask, which covers an outer periphery of the substrate during the sputtering, to fix the position of the substrate.

However, it is difficult to surely position and hold the substrate during the sputtering only with the outer mask. The substrate is also easily displaced due to the deformation of the substrate caused by the heat generated during the sputtering.

SUMMARY OF THE INVENTION

The present invention is directed to a solution to the above described disadvantage, and it is an object of the present invention to provide a method for manufacturing a disc-shaped optical recording medium according to which a substrate can surely be positioned and held at the time of sputtering. According to the method, a layer is formed on the substrate without a central hole for optical disk chucking by sputtering before a central hole may be formed. It is another object of the invention to provide a disc-shaped substrate for optical recording medium.

After intensive research, the inventors have found that the above-described disadvantage is solved by the use of a positioning guide, for example, having circular recesses on a non-sputtering surface of a disc-shaped substrate in positioning during the sputtering process.

That is, the present invention described below allows the aforementioned objects to be achieved.

(1) A method for manufacturing a disc-shaped optical recording medium comprising: a step of forming a disc-shaped substrate without a central hole for optical medium chucking, so that said disc-shaped substrate has a positioning guide formed in a non-sputtering surface being one surface of said disc-shaped substrate; at least one sputtering step of forming a film on a sputtering surface with sputtering of said disc-shaped substrate positioned by a carrier, while said positioning guide positions said disc-shaped substrate in place.

(2) The method according to (1), wherein said positioning guide is a circular recess formed at a center of said disc-shaped substrate during the step of forming the disc-shaped substrate without a central hole, said circular recess having a depth not large enough to penetrate through the disc-shaped substrate in a thickness-wise direction.

(3) The method according to (2), wherein said carrier is provided with an outer mask for covering an outer periphery of said disc-shaped substrate and a positioning member engaged with said circular recess, and said outer mask and said positioning member fixes a position of said disc-shaped substrate when the sputtering is carried out.

(4) The method according to (3), wherein said positioning member protrudes in a direction of pushing said disc-shaped substrate to detach said disc-shaped substrate from said carrier by pushing the substrate with said positioning member from its backside after the sputtering.

(5) The method according to claim 1, wherein said disc-shaped substrate is pushed out from its backside after the sputtering.

(6) The method according to any one of (2), (3) and (4), further comprising the step of perforating a region including said circular recess of said disc-shaped substrate after the sputtering step to form a central hole for optical medium chucking.

(7) The method according to (1) or (2), wherein a mechanical clamp for holding the positioning guide is engaged with said positioning guide to fix a position of said disc-shaped substrate.

(8) The method according to any one of (3), (4) and (6), wherein said positioning member is a mechanical clamp engaged with an inside of said circular recess.

(9) The method according to any one of (1) to (8), wherein the disc-shaped substrate has no central hole and has a continuous surface from its periphery to the center thereof before completing the sputtering step.

(10) The method according to any one of (2), (3), (4), (6), (8), wherein, in the sputtering step, said carrier includes a holder surface with flat and watertight structure, said holder surface makes contact with an outside region of said circular recess on the non-sputtering surface of the disc-shaped substrate to hold the disc-shaped substrate, said holder surface being cooled with a gas refrigerant from a backside thereof.

(11) A disc-shaped substrate for a disc-shaped optical recording medium, on a surface of which at least one-film is formed by sputtering, the substrate comprising: a sputtering surface being one surface of said disc-shaped substrate, said sputtering surface being a continuous surface from a periphery to a vicinity of the center thereof without a central hole for optical medium chucking; a non-sputtering surface being the other surface of said disc-shaped substrate, having a circular recess formed at a center of said non-sputtering surface.

(12) The disc-shaped substrate according to (10), wherein a removal region is formed inside said circular recess at the center of the disc-shaped substrate to form a central hole for optical medium chucking.

DETAILED DESCRIPTION OF THE PREFERRED EMBODIMENTS

Now, an embodiment of the invention will be described in detail in conjunction with the accompanying drawings.

Figure 1:
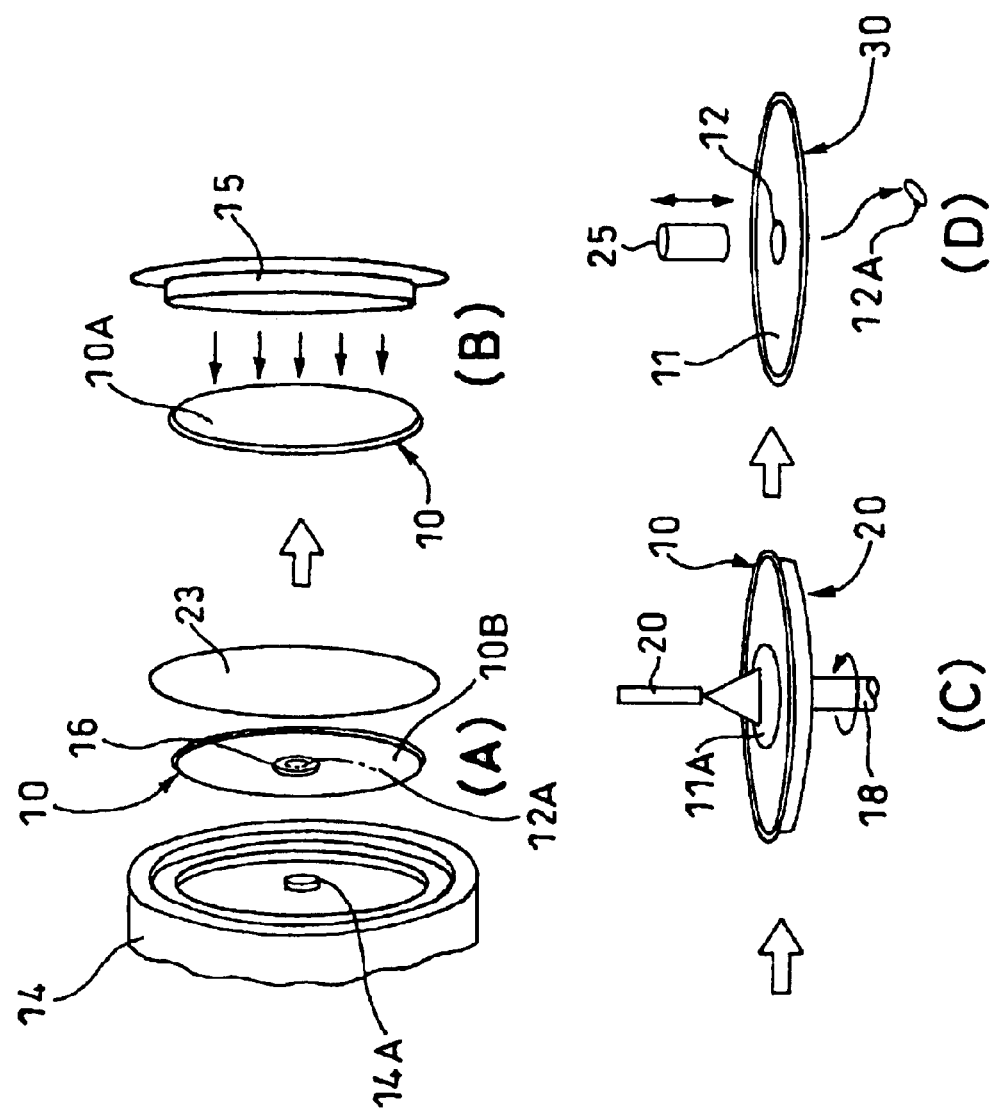
FIGS. 1A to 1D are perspective views for use in illustration of a method for manufacturing a disc-shaped optical recording medium according to an embodiment of the invention.

As shown in FIGS. 1A to 1D, the method for manufacturing a disc-shaped optical recording medium according to the embodiment includes an injection molding step of injection molding a disc-shaped substrate 10 for an optical recording medium (see FIG. 1A), at least one sputtering step of forming a film on one of surfaces of the injection molded disc-shaped substrate 10 or a sputtering surface 10A (see FIG. 1B), a spin-coating step of coating the film formed by the sputtering with resin to form a light transmitting resin layer 11 (see FIG. 1C), and a perforating step of removing a circular removal region 12A in the center of the disc-shaped substrate 10 with the light transmitting resin layer 11 formed thereon, thereby forming a central hole 12 (see FIG. 1D). The reference numeral 15 in FIG. 1B represents a target for sputtering and 30 in FIG. 1D represents a disc-shaped recording medium in its completed state.

A mold 14 for injection molding is provided with a mold projection 14A. The projection 14A forms a circular recess 16 (refer to FIGS. 2 and 3) not deep enough to penetrate in the thickness-wise direction through the substrate 10 in the center of a non-sputtering surface 10B opposite to the sputtering surface 10A.

The circular recess 16 is important for use in forming a central hole for chucking by perforating a central part which corresponds to the bottom of the recess in the succeeding process.

Figure 4:
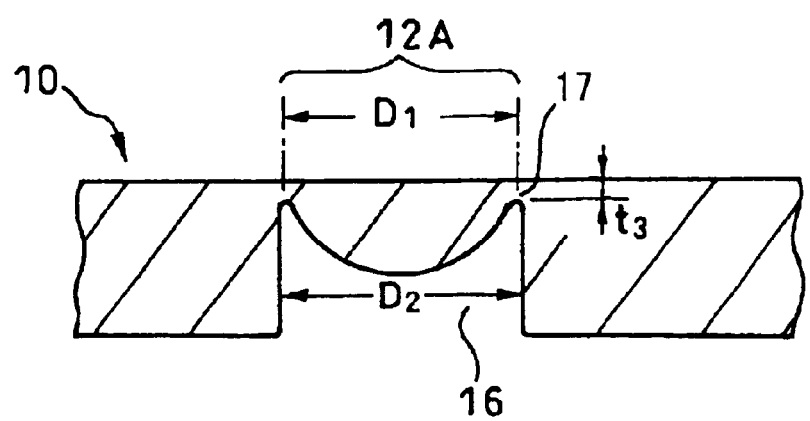
FIG. 4 is an enlarged sectional view of the disc-shaped substrate.

As shown in FIG. 4, the circular recess 16 in an approximately circular shape preferably has a diameter larger than that of the central hole 12. This is because a contact defect between a perforation member (perforation edge) and the disc-shaped substrate 10 during the perforation step or a burr left after the perforation should be taken into account. It is preferable to form the diameter $D_2$ of the circular recess 16 larger than a diameter $D_1$ of the removal region 12A by 0.02 mm or more, but sizes of the diameters $D_1$ and $D_2$ have to be properly selected in accordance with a required specification.

It is preferable that a thickness $t_3$ of a ring-shaped removal region 17, which corresponds to a periphery of the bottom of the circular recess 16, is thin enough to reduce a strain and a defect in perforation. However, if the thickness is too thin, fluidity of the resin can be impaired in injection molding the disc-shaped substrate 10. In order to neatly mold the disc-shaped substrate 10, the thickness $t_3$ should be equal to or greater than 0.1 mm, and in consideration of easy to perforating, it should be equal to or lower than 0.3 mm.

In the sputtering process, the film is formed on an inner portion of the sputtering surface 10A with an outer portion thereof covered with an outer mask 13.

Figure 2:
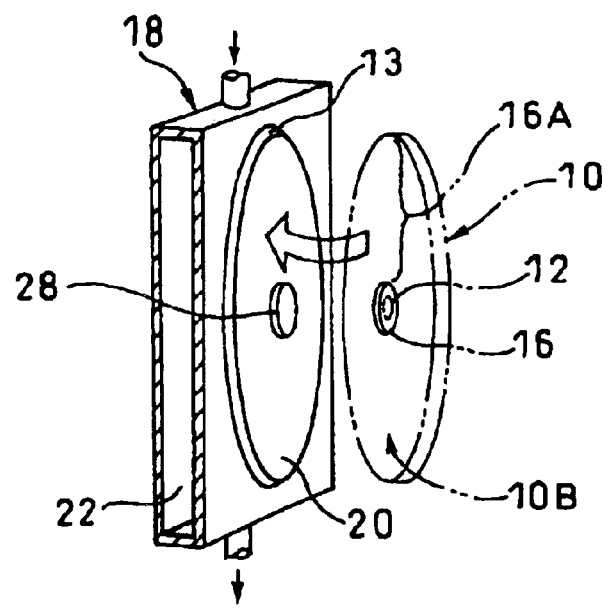
FIG. 2 is a perspective view of a carrier for holding a disc-shaped substrate for use in a sputtering process of the manufacturing method.
Figure 3:
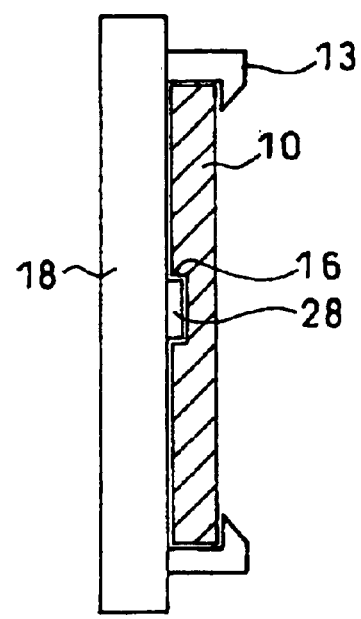
FIG. 3 is a sectional view of the carrier and the disc-shaped substrate.

The disc-shaped substrate 10 is mounted on the carrier 18 of which enlarged view is shown in FIGS. 2 and 3 and is subjected to sputtering. The carrier 18 has the outer mask 13 attached thereto to cover the outer periphery of the disc-shaped substrate 10 when the disc-shaped substrate 10 is mounted on the carrier 18.

The carrier 18 is provided with a flat holder surface 20 with which the outside region 16A of the circular recess 16 on the non-sputtering surface 10B makes contact. The holder surface 20 has a watertight structure in which any liquid or gas does not pass through, to tightly make contact with the disc-shaped substrate 10.

In a backside of the holder surface 20, there is cooling means 22 through which a gas refrigerant, a liquid refrigerant, or the like circulates.

The carrier 18 with the disc-shaped substrate 10 is attached to a predetermined place in a sputtering chamber (not shown) so that the disc-shaped substrate 10 is in an aligned condition in which the sputtering process is performed.

When the disc-shaped substrate 10 is mounted on the carrier 18 to be positioned, a projective member 28 provided in the carrier 18 is fitted into the circular recess 16 formed at the center of the non-sputtering surface 10B of the disc-shaped substrate 10, so that the disc-shaped substrate 10 is positioned and held in a predetermined position. Such a projective member and a recess may have a mechanical clamp mechanism, as will hereinafter be described in detail. In that case, it is possible to hold the disc-shaped substrate 10 more surely with a larger holding force.

The projective member 28 is arranged at the approximate center of the holder surface 20, and is configured such that the end thereof can be further protruded in a forward direction from the positioning state. Therefore, the projection of the projective member 28 can detach the disc-shaped substrate 10 from the holder surface 20 after the film is formed.

According to the embodiment of the method for manufacturing a disc-shaped optical recording medium, first the disc-shaped substrate 10 is formed by injection molding, and during the process, a pit (bump) pattern constituting an information recording/reproducing region is transferred on the sputtering surface 10A of the disc-shaped substrate 10 with a stamper 23, for example. The circular recess 16 is simultaneously formed in the center of the non-sputtering surface 10B.

A recording layer, a reflective layer, and the like are formed on the surface having the information recording/reproducing region or the sputtering surface 10A by sputtering.

In the sputtering process, the disc-shaped substrate 10 is mounted on the carrier 18 with the non-sputtering surface 10B tightly making contact with the holder surface 20, and with the projective member 28 fitted into the circular recess 16. When the disc-shaped substrate 10 is mounted, the outer mask 13 covers the outer portion of the sputtering surface 10A.

In the prior art, it was difficult that the non-sputtering surface of the disc-shaped substrate directly makes contact with the carrier, because the non-sputtering surface is a light incident surface of the completed optical disc which must remain intact without any scratch. However, in the optical disc according to the present invention, the light incident surface is formed on the non-sputtering surface 10B after the sputtering process. Thus, the non-sputtering surface 10B can directly make contact with the carrier 18. Adopting this way to hold a disc-shaped substrate, it is easy to efficiently cool the disc to control temperature of the disc-shaped substrate during sputtering.

The sputtering is carried out under the condition stated above in which the refrigerant circulates through the cooling means 22 to cool the non-sputtering surface 10B via the holder surface 20.

At this time, since the outer portion of the disc-shaped substrate 10 is covered with the outer mask 13, any film is not formed on this outer portion.

During the sputtering, the holder surface 20 of the carrier 18 is cooled with the circulating refrigerant at the backside thereof. At this time, the film is efficiently formed because the disc-shaped substrate 10 is sufficiently cooled down through the non-sputtering surface 10B being in contact with the holder surface 20.

The holder surface 20 with the flat and watertight structure can sufficiently cool down the disc-shaped substrate 10 without any adverse effect on sputtering, because any liquid or gas does not pass therethrough.

After the sputtering, the carrier 18 with the disc-shaped substrate 10 is taken out of the sputtering chamber. Then, the disc-shaped substrate 10 is easily detached from the holder surface 20 while the projective member 28 of the carrier 18 protrudes forward.

Then, in the spin-coating process, the light transmitting resin layer 11 is formed on the film formed in the sputtering process. The transmitting resin layer 11 is formed, for example, by spreading ultraviolet curing resin 11A, and then curing it by UV beam irradiation.

Then, an ultrasonic press 25 or a simple perforation process removes the removal region 12A to form the central hole 12 for optical medium chucking as shown in FIG. 1D.

Figure 5:
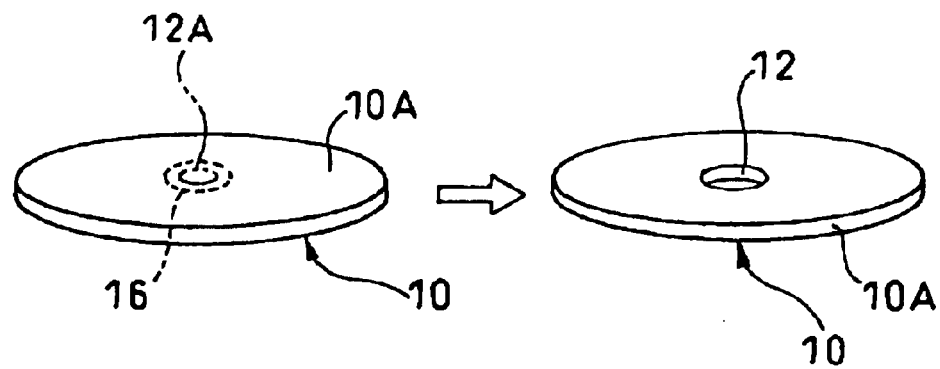
FIG. 5 is a schematic perspective view of the disc-shaped substrates before and after a central hole is formed.

Referring to FIG. 5, the removal region 12A is provided inside the circular recess 16 at the center of the disc-shaped substrate 10. In other words, a diameter of the circular recess 16 is larger than that of the central hole 12. Thus, an inner surface of the circular recess 16 remains in a completed disc-shaped optical recording medium 30 as one of main portions of the central hole 12.

In the above embodiment, the carrier 18 for holding the disc-shaped substrate 10 has the holder surface 20. However, the carrier 18 is not necessarily provided with the holder surface 20 as long as the carrier 18 can maintain the flatness of the disc-shaped substrate 10. The cooling means with the refrigerant is not necessary, either. After the layers are formed, the disc-shaped substrate 10 may be detached from the carrier 18 with a device other than the projective member 28.

In the above-embodiment, the projective member 28 is fitted into the circular recess 16 so that the disc-shaped substrate 10 is positioned and held in the predetermined position of the carrier 18. However, the present invention is not limited to this embodiment, and it may be possible to substitute a positioning guide provided in the non-sputtering surface 10B for the circular recess. Also the recess may be in a different shape from a circle.

Figure 6:
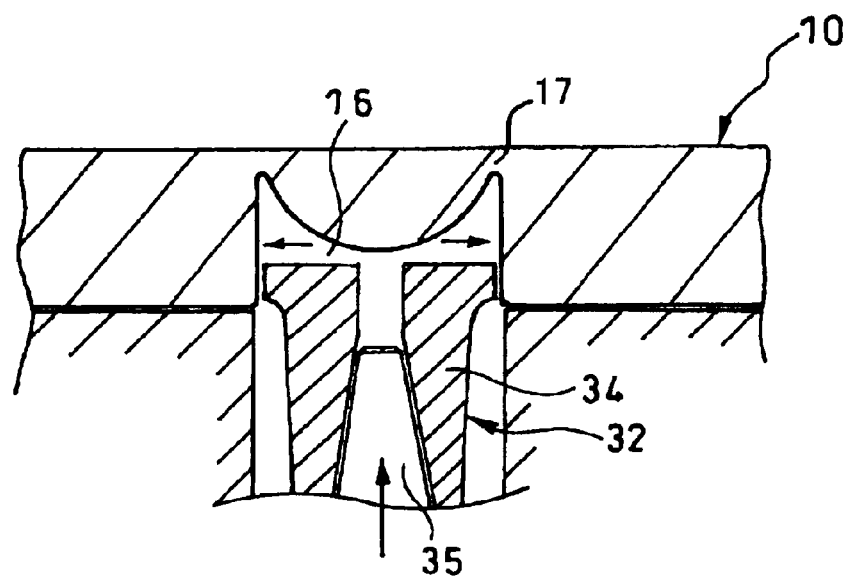
FIG. 6 is a sectional view of a main portion of a mechanical clamp which positions and holds the disc-shaped substrate.
Figure 7:
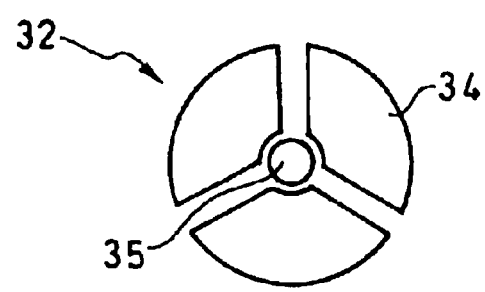
FIG. 7 is a top plan view of FIG. 6.

The projective member in the carrier 18, for example, may be a mechanical clamp 32 shown in FIGS. 6 and 7.

When operating a taper shaft 35 of the mechanical clamp 32, a claw 34 expands and is engaged with the circular recess 16 or a different-shaped positioning guide, so that the disc-shaped substrate 10 is fixedly positioned.

As described above, according to the invention, when a film is formed on the disc-shaped substrate for a disc-shaped optical recording medium by sputtering, the disc-shaped substrate may accurately be positioned and stably held.

What is claimed is:

1. A method for manufacturing a disc-shaped optical recording medium comprising:

a step of forming a disc-shaped substrate without a central hole for optical medium chucking, so that said disc-shaped substrate has a positioning guide formed in a non-sputtering surface being one surface of said disc-shaped substrate;

at least one sputtering step of forming a film on a sputtering surface with sputtering of said disc-shaped substrate positioned by a carrier, while said positioning guide positions said disc-shaped substrate in place;

said positioning guide is a circular recess formed at a center of said disc-shaped substrate during the step of forming the disc-shaped substrate without a central hole, said circular recess having a death not large enough to penetrate through the disc-shaped substrate in a thickness-wise direction; and a step of performing a region including said circular recess of said disc-shaped substrate after the sputtering step to form a central hole for optical medium chucking.

2. A method for manufacturing a disc-shaped optical recording medium comprising:

a step of forming a disc-shaped substrate without a central hole for optical medium chucking, so that said disc-shaped substrate has a positioning guide formed in a non-sputtering surface being one surface of said disc-shaped substrate;

at least one sputtering step of forming a film on a sputtering surface with sputtering of said disc-shaped substrate positioned by a carrier, while said positioning guide positions said disc-shaped substrate in place;

said carrier is provided with an outer mask for covering an outer periphery of said disc-shaped substrate and a positioning member engaged with said circular recess;

and said outer mask and said positioning member fixes a position of said disc-shaped substrate when the sputtering is carried out.

3. The method according to claim 2, wherein said positioning member protrudes in a direction of pushing said disc-shaped substrate to detach said disc-shaped substrate from said carrier by pushing the substrate with said positioning member from its backside after the sputtering.

4. The method according to claim 1, wherein said disc-shaped substrate is pushed out from its backside after the sputtering.

5. The method according to claim 2, further comprising the step of perforating a region including said circular recess of said disc-shaped substrate after the sputtering step to form a central hole for optical medium chucking.

6. The method according to claim 3, further comprising the step of perforating a region including said circular recess of said disc-shaped substrate after the sputtering step to form a central hole for optical medium chucking.

7. The method according to claim 1, wherein a mechanical clamp for holding the positioning guide is engaged with said positioning guide to fix a position of said disc-shaped substrate.

8. The method according to claim 1, wherein a mechanical clamp for holding the positioning guide is engaged with said positioning guide to fix a position of said disc-shaped substrate.

9. The method according to claim 2, wherein said positioning member is a mechanical clamp engaged with an inside of said circular recess.

10. The method according to claim 3, wherein said positioning member is a mechanical clamp engaged with an inside of said circular recess.

11. The method according to claim 1, wherein said positioning member is a mechanical clamp engaged with an inside of said circular recess.

12. The method according to claim 1, wherein the disc-shaped substrate has no central hole and has a continuous surface from its periphery to the center thereof before completing the sputtering step.

13. The method according to claim 2, wherein the disc-shaped substrate has no central hole and has a continuous surface from its periphery to the center thereof before completing the sputtering step.

14. The method according to claim 3, wherein the disc-shaped substrate has no central hole and has a continuous surface from its periphery to the center thereof before completing the sputtering step.

15. The method according to claim 4, wherein the disc-shaped substrate has no central hole and has a continuous surface from its periphery to the center thereof before completing the sputtering step.

16. The method according to claim 1, wherein, in the sputtering step, said carrier includes a holder surface with flat and watertight structure, said holder surface makes contact with an outside region of said circular recess on the non-sputtering surface of the disc-shaped substrate to hold the disc-shaped substrate, said holder surface being cooled with a gas refrigerant from a backside thereof.

17. The method according to claim 2, wherein, in the sputtering step, said carrier includes a holder surface with flat and watertight structure, said holder surface makes contact with an outside region of said circular recess on the non-sputtering surface of the disc-shaped substrate to hold the disc-shaped substrate, said holder surface being cooled with a gas refrigerant from a backside thereof.

18. The method according to claim 3, wherein, in the sputtering step, said carrier includes a bolder surface with flat and watertight structure, said holder surface makes contact with an outside region of said circular recess on the non-sputtering surface of the disc-shaped substrate to hold the disc-shaped substrate, said holder surface being cooled with a gas refrigerant from a backside thereof.

19. The method according to claim 1, wherein, in the sputtering step, said carrier includes a holder surface with flat and watertight structure, said holder surface makes contact with an outside region of said circular recess on the non-sputtering surface of the disc-shaped substrate to hold the disc-shaped substrate, said holder surface being cooled with a gas refrigerant from a backside thereof.

20. A disc-shaped substrate for a disc-shaped optical recording medium, on a surface of which at least one film is formed by sputtering, the substrate comprising:

a sputtering surface being one surface of said disc-shaped substrate, said sputtering surface being a continuous surface from a periphery to a vicinity of the center thereof without a central hole;

a non-sputtering surface being the other surface of said disc-shaped substrate, having a circular recess formed at a center of said non-sputtering surface;

wherein a ring-shaped removal region is formed inside said circular recess at the center of the disc-shaped substrate to form a central hole for optical medium chucking; and the thickness of the ring-shaped region, which corresponds to a periphery of the bottom of the circular recess, is thin enough to reduce a strain and defect in perforation.

21. The disc-shaped substrate according to claim 20, wherein the thickness of the ring-shaped removal region is equal to or greater than 0.1 mm and equal to or lower than 0.3 mm.

* * * * *